(12) United States Patent
Ito

(10) Patent No.: US 7,566,584 B2
(45) Date of Patent: Jul. 28, 2009

(54) ELECTRONIC SUBSTRATE MANUFACTURING METHOD, SEMICONDUCTOR DEVICE MANUFACTURING METHOD, AND ELECTRONIC EQUIPMENT MANUFACTURING METHOD

(75) Inventor: Haruki Ito, Chino (JP)

(73) Assignee: Seiko Epson Corporation (JP)

( * ) Notice: Subject to any disclaimer, the term of this patent is extended or adjusted under 35 U.S.C. 154(b) by 59 days.

(21) Appl. No.: 11/417,301

(22) Filed: May 2, 2006

(65) Prior Publication Data

US 2006/0263930 A1 Nov. 23, 2006

(30) Foreign Application Priority Data

May 23, 2005 (JP) ............................. 2005-149097

(51) Int. Cl.
*H01L 21/20* (2006.01)

(52) U.S. Cl. ..................... 438/106; 438/117; 438/124; 438/125; 438/127; 257/E21.513; 257/E23.077

(58) Field of Classification Search ................ 257/678, 257/E21.513, E23.077; 438/106, 124, 125, 438/127

See application file for complete search history.

(56) References Cited

U.S. PATENT DOCUMENTS

| | | | | |
|---|---|---|---|---|
| 4,568,592 A | * | 2/1986 | Kawaguchi et al. | 428/107 |
| 4,989,955 A | * | 2/1991 | Ito et al. | 349/157 |
| 5,290,614 A | * | 3/1994 | Narushima et al. | 428/40.1 |
| 5,570,506 A | * | 11/1996 | Tawata et al. | 29/851 |
| 5,756,190 A | * | 5/1998 | Hosomi et al. | 428/209 |
| 5,837,155 A | * | 11/1998 | Inagaki et al. | 216/18 |
| 6,528,874 B1 | * | 3/2003 | Iijima et al. | 257/700 |
| 6,565,954 B2 | * | 5/2003 | Andou et al. | 428/209 |
| 6,590,291 B2 | | 7/2003 | Akagawa | |
| 6,703,262 B2 | * | 3/2004 | Itagaki et al. | 438/124 |
| 6,844,116 B2 | * | 1/2005 | Takada et al. | 430/5 |
| 7,001,662 B2 | * | 2/2006 | Sugaya et al. | 428/344 |
| 7,247,529 B2 | * | 7/2007 | Shoji et al. | 438/166 |
| 7,285,305 B2 | | 10/2007 | Furusawa et al. | |
| 7,285,862 B2 | | 10/2007 | Sunohara et al. | |
| 7,297,876 B2 | | 11/2007 | Sakurai et al. | |
| 7,330,612 B2 | * | 2/2008 | Nakashiba et al. | 385/14 |
| 2003/0059987 A1 | | 3/2003 | Sirringhaus et al. | |
| 2004/0038471 A1 | * | 2/2004 | Sakamoto et al. | 438/200 |
| 2004/0049912 A1 | | 3/2004 | Akagawa et al. | |
| 2004/0082100 A1 | | 4/2004 | Tsukahara et al. | |
| 2005/0045379 A1 | | 3/2005 | Sakurai et al. | |

(Continued)

FOREIGN PATENT DOCUMENTS

EP 0 615 285 9/1994

(Continued)

OTHER PUBLICATIONS

Communication from European Patent Office re: related application.

*Primary Examiner*—Michael S Lebentritt
(74) *Attorney, Agent, or Firm*—Harness, Dickey & Pierce, P.L.C.

(57) ABSTRACT

A method of manufacture of an electronic substrate, having a process of embedding electronic components in a substrate, and a process of ejecting liquid droplets containing a conductive material, to form a wiring pattern connected to the external connection electrodes of the electronic components embedded in the substrate.

15 Claims, 8 Drawing Sheets

U.S. PATENT DOCUMENTS

| | | |
|---|---|---|
| 2005/0048698 A1* | 3/2005 | Yamaguchi ................ 438/109 |
| 2005/0073029 A1 | 4/2005 | Chua et al. |
| 2005/0161783 A1* | 7/2005 | Hashimoto ................ 257/678 |
| 2006/0054707 A1* | 3/2006 | Akita et al. ................ 235/492 |
| 2006/0068525 A1* | 3/2006 | Uehara et al. ............... 438/125 |
| 2007/0222062 A1 | 9/2007 | Sunohara et al. |
| 2007/0224731 A1 | 9/2007 | Sunohara et al. |

FOREIGN PATENT DOCUMENTS

| | | |
|---|---|---|
| FR | 2 780 534 | 12/1999 |
| JP | 62-182591 | 11/1987 |
| JP | 63-138795 | 6/1988 |
| JP | 03-069191 | 3/1991 |
| JP | 11-274671 | 10/1999 |
| JP | 2001-217337 | 8/2001 |
| JP | 2002-280744 | 9/2002 |
| JP | 2003-101245 | 4/2003 |
| JP | 2003-309369 | 10/2003 |
| JP | 2004-055967 | 2/2004 |
| JP | 2004-096058 | 3/2004 |
| JP | 2004-247706 | 9/2004 |
| JP | 2005-079276 | 3/2005 |
| JP | 2005235964 | 9/2005 |

* cited by examiner

ELECTRONIC SUBSTRATE MANUFACTURING METHOD, SEMICONDUCTOR DEVICE MANUFACTURING METHOD, AND ELECTRONIC EQUIPMENT MANUFACTURING METHOD

CROSS-REFERENCE TO RELATED APPLICATION

This application claims priority to Japanese Patent Application No. 2005-149097, filed May 23, 2005, the contents of which are incorporated herein by reference.

BACKGROUND

1. Technical Field

This invention relates to an electronic substrate manufacturing method, a semiconductor device manufacturing method, and an electronic equipment manufacturing method.

2. Related Art

With the enhanced performance and increasing compactness of electronic equipment in recent years, there have been demands for electronic substrates for electronic component mounting with ever-higher densities and greater functionality. For example, Japanese Unexamined Patent Application, First Publication No. H03-69191 (Patent Literature 1) discloses technology in which electronic components are mounted on copper wiring formed on the substrate, an electronic component embedding layer of resin is formed to cover the components all at once, and by using an adhesive to stack layers of such electronic component embedding layers, an electronic substrate is manufactured.

In Japanese Unexamined Patent Application, First Publication No. 2004-55967 (Patent Literature 2), technology is disclosed to realize a thin electronic substrate by pressing electronic components into an electrically insulating sheet and applying heat and pressure to integrate this with an electrically insulating sheet having conductive paste, which is in contact with the external connection electrodes of the electronic components.

In the technology of Patent Literature 1, electronic components are mounted on a substrate material having copper wiring, so that reduction of thickness and increases in density have been difficult. In the technology of Patent Literature 2, it is necessary to separately prepare an electrical insulation sheet on which conductive paste is formed at positions corresponding to the external connection electrodes of the electronic components, possibly resulting in increased costs and lowered productivity.

SUMMARY

An advantage of some aspects of the invention is to provide an electronic substrate manufacturing method, semiconductor device manufacturing method, and electronic equipment manufacturing method, capable of achieving thin shapes and high densities, without incurring increases in cost or declines in productivity.

An electronic substrate manufacturing method according to a first aspect of the invention includes a process of embedding the electronic component in the substrate, and a process of ejecting a liquid droplet containing a conductive material, and forming a wiring pattern connected to the external connection electrode of the electronic component embedded in the substrate.

Hence in an electronic substrate manufacturing method of this invention, electronic component is embedded in a substrate, so that an electronic substrate can be manufactured which is thinner to the extent of the depth of the embedding; and greater thinness and higher density can be achieved. Furthermore, in this invention a wiring pattern to connect the external connection electrode of the electronic component embedded in the substrate is formed by a liquid droplet ejection method, so that material consumption can be reduced. Also, by moving a head according to the shape of the wiring pattern, any arbitrary shape can be formed simply and easily. As a result, an electronic substrate can be manufactured without incurring increased costs or lowered productivity.

As the processing embedding the electronic component in the substrate, by adopting a process of heating the electronic component and a process of bringing the heated electronic component into contact with the substrate and causing the substrate to be softened, the electronic component can easily be embedded in the softened substrate.

Furthermore, by using a substrate formed from a resin material in a semi-cured state, the electronic component can easily be embedded in the substrate.

It is preferable that a process be provided in which, when a substrate formed from a resin sheet material in a semi-cured state is used, after forming the wiring pattern on the resin material, the resin sheet material and the wiring pattern are cured.

By this means, in this invention the adhesion of the wiring pattern to the substrate can be improved.

In this invention, a procedure can also be suitably adopted having a process of ejecting a liquid droplet containing an insulating material to form an insulating layer. By this means, an insulating layer can be formed simply and easily. In this case, it is preferable that a process be provided in which, after forming the insulating layer on the substrate in a semi-cured state, the substrate and insulating layer are cured. By this means, in this invention the adhesion of the insulating layer to the substrate can be improved.

When an insulating layer is formed, it is preferable that a process be provided in which a conducting post, which penetrate the insulating layer and are connected to the external connection electrode and to the wiring pattern, are formed by ejection of a liquid droplet. By this means, the wiring pattern formed on the insulating layer and the external connection electrode of the electronic component can be easily connected electrically.

Furthermore, a procedure of repeating the processes of formation of a wiring pattern and formation of an insulating layer can be suitably adopted.

By this means, in this invention a thin and high-density multilayer substrate can be manufactured easily and at low cost.

Furthermore, when forming a multilayer substrate, it is suitable to provide a process in which a liquid droplet containing an electronic element formation material is ejected, to form an electronic element.

By this means, in this invention a highly functional electronic substrate can be formed.

A semiconductor device manufacturing method according to a second aspect of the invention includes a process of mounting a semiconductor device on a substrate, the semiconductor device manufactured by the electronic substrate manufacturing method described above.

Hence in a semiconductor device manufacturing method of this invention, thin and compact semiconductor device can be manufactured without incurring increases in cost or declines in productivity.

In this invention, it is preferable that a process be provided in which a liquid droplet containing a conductive material is ejected, to form an external connection terminal connected to the semiconductor element.

By this means, in this invention, material consumption can be reduced, and an external connection element can be formed simply and easily at arbitrary positions.

In this case, as the external connection element, a penetrating electrode which penetrates the substrate can be connected to the semiconductor element. By this means, the external connection terminal can be provided on the side opposite the side of the semiconductor element embedded in the substrate.

An electronic equipment manufacturing method according to a third aspect of the invention includes a process of mounting a semiconductor device on a substrate, the semiconductor device manufactured by the semiconductor device manufacturing method described above.

Hence in this invention, compact and thin electronic equipment can be manufactured without incurring increases in cost or lowered productivity.

It is preferable that the process of mounting have a process of bonding a substrate formed from a resin sheet material in a semi-cured state to a housing which supports the semiconductor device, and a process of forming a wiring pattern connected to the external connection electrode of the semiconductor element embedded in the substrate.

Hence in this invention, the substrate is bonded directly to the housing, so that electronic equipment which is more thin and compact can be manufactured.

DESCRIPTION OF EXEMPLARY EMBODIMENTS

Below, embodiments of an electronic substrate manufacturing method, semiconductor device manufacturing method, and electronic equipment manufacturing method of this invention are explained, referring to FIGS. 1 to 8.

Liquid Droplet Ejection Device

Figure 1:
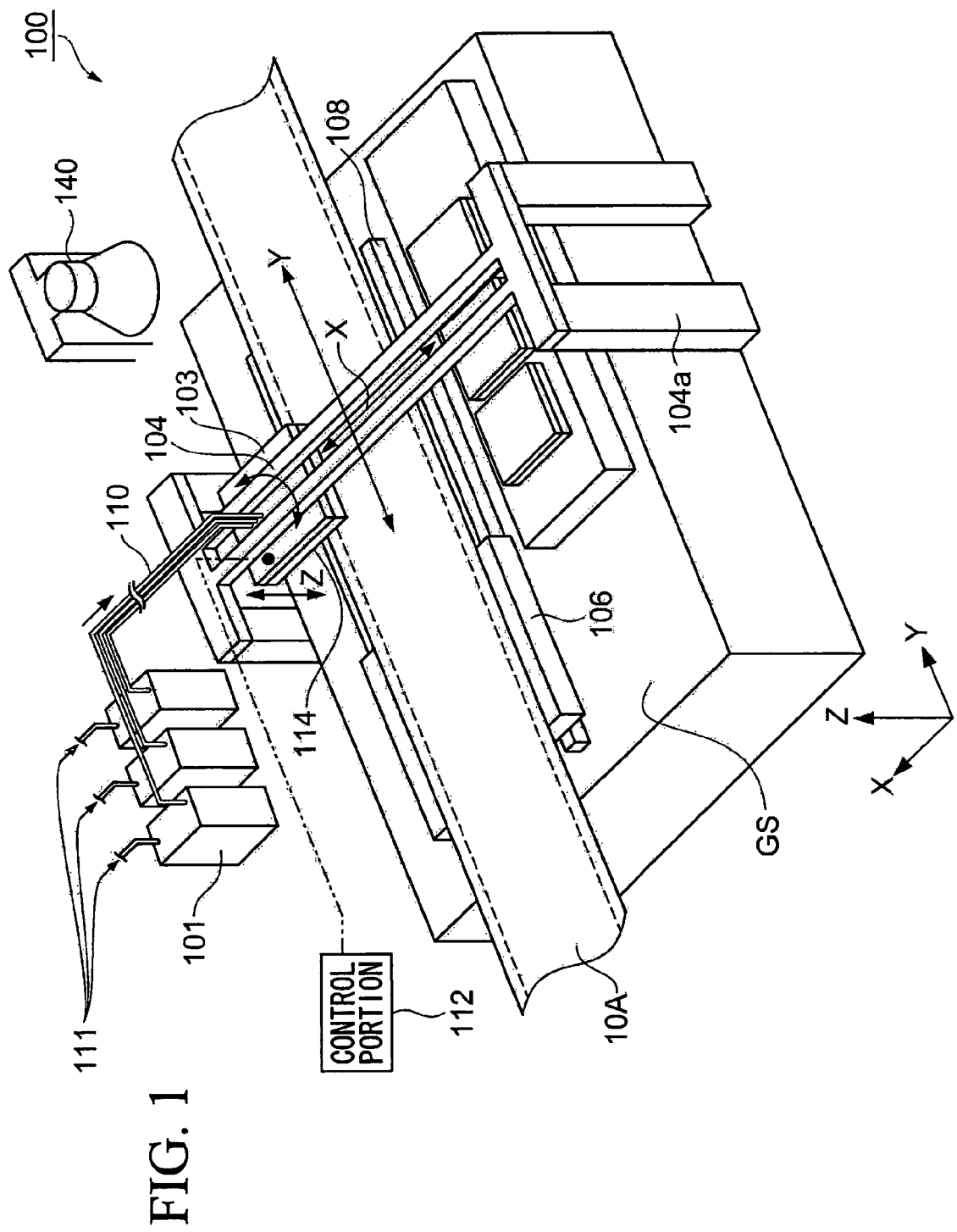
FIG. 1 is a schematic diagram showing a liquid droplet ejection device used in the manufacture of an electronic substrate.
Figure 2A:
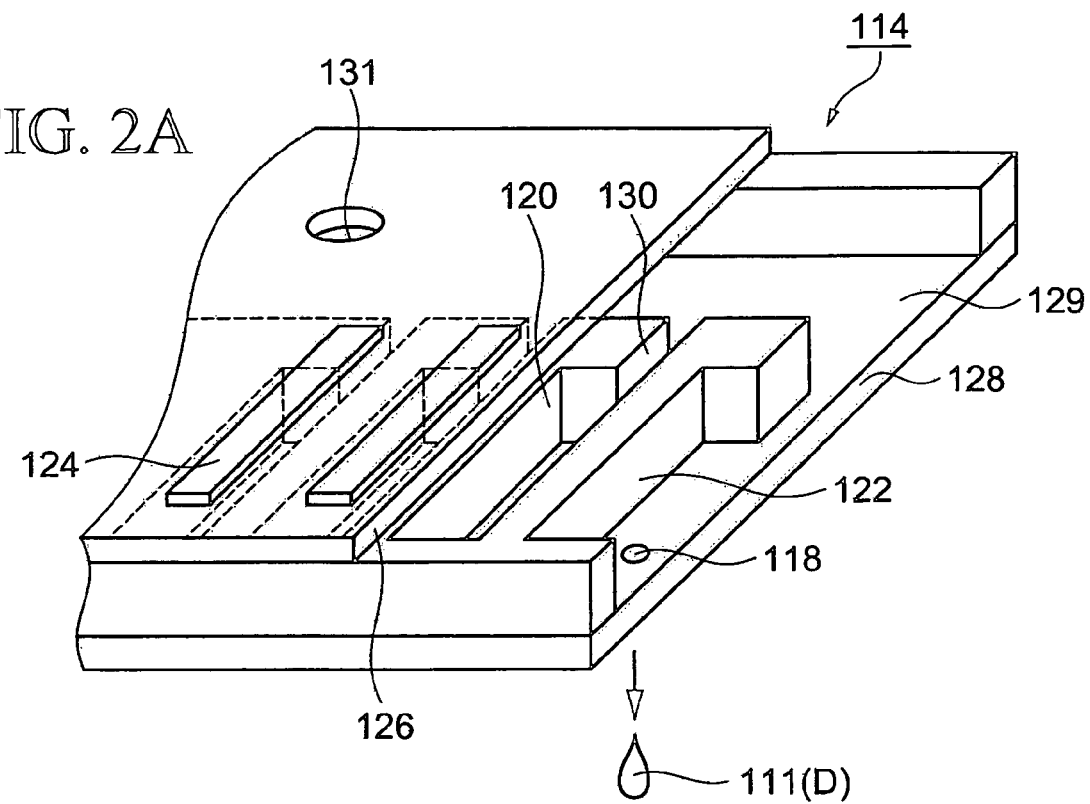
FIG. 2A and FIG. 2B are schematic diagrams showing the head in a liquid droplet ejection device.
Figure 2B:
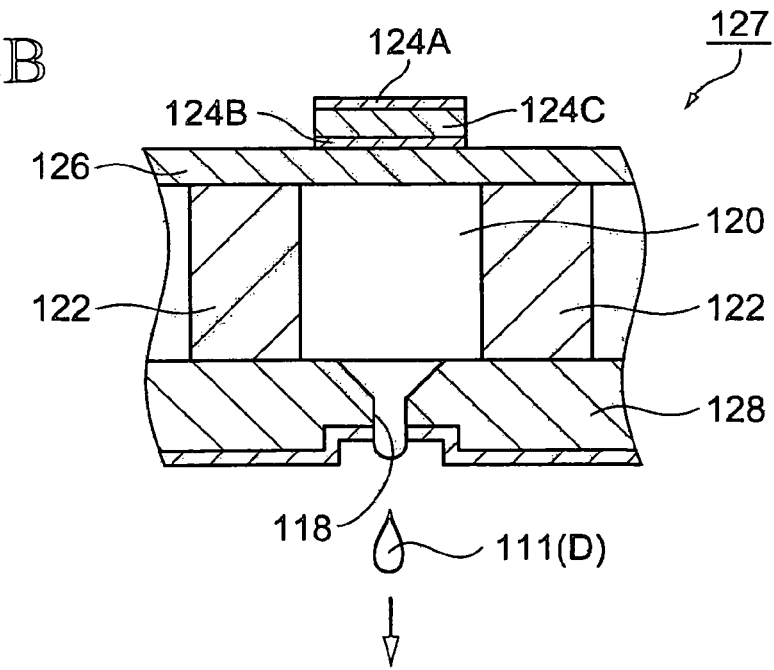

First, a liquid droplet ejection device used in the manufacture of an electronic substrate, semiconductor device, and electronic equipment is explained, referring to FIGS. 1, 2A, and 2B.

The liquid droplet ejection device 100 shown in FIG. 1 is, in essence, an inkjet device. More specifically, the liquid droplet ejection device 100 has a tank 101 which holds liquid material 111, a tube 110, a grand stage GS, a ejection head portion 103, a stage 106, a first position control device 104, a second position control device 108, a control portion 112, a light irradiation device 140, and a support portion 104a.

The ejection head portion 103 holds the head 114 (see FIGS. 2A and 2B). The head 114 ejects liquid droplets of the liquid material 111 according to signals from the control portion 112. The head 114 in the ejection head portion 103 is connected via the tube 110 to the tank 110 so as to enable flow. Liquid material 111 is supplied from the tank 101 to the head 114.

The stage 106 provides a flat surface to fix in place the substrate (a resin substrate 5, described below). Furthermore, the stage 106 has a function for using a vacuum force to fix the position of the substrate.

The first position control device 104 fixes the position at a prescribed height from the grand stage GS by means of the support portion 104a. The first position control device 104 has functions for moving the ejection head portion 103 in the X-axis direction and in the Z-axis direction perpendicular to the X-axis direction, according to signals from the control portion 112. Furthermore, the first position control device 104 also has a function for rotating the ejection head portion 103 about an axis parallel to the Z axis. In this embodiment, the Z-axis direction is a direction parallel to the vertical direction (that is, the direction of gravitational acceleration).

The second position control device 108 moves the stage 106 in the Y-axis direction on the grand stage GS according to signals from the control portion 112. The Y-axis direction, X-axis direction, and Z-axis direction are mutually orthogonal directions.

The first position control device 104 and second position control device 108 having the functions described above can be realized using well-known XY robots employing linear motors and servo motors. Here, the details of the configuration of these devices are omitted. In this Specification, the first position control device 104 and second position control device 108 are described, as necessary, as a "robot" or a "scanning portion".

As described above, the ejection head portion 103 moves in the X-axis direction by means of the first position control device 104. The substrate moves together with the stage 106 in the Y-axis direction by means of the second position control device 108. As a result of these, the position of the substrate relative to the head 114 changes. That is, the ejection head portion 103, head 114, and nozzles 118 (see FIGS. 2A and 2B) are moved relative to the substrate in the X-axis direction and Y-axis direction while being held at a prescribed distance in the Z-axis direction, that is, scan the substrate in relative motion. "Relative motion" or "scanning" mean that at least one among the object which ejects liquid material 111, and the object onto which the material is ejected (the ejection-receiving portion), is caused to move relative to the other.

The control portion 112 is configured such that ejection data, indicating the relative position at which liquid droplets of the liquid material 111 are to be ejected, can be received from an external information processing device. The control portion 112 stores the received ejection data in an internal storage device, and controls the first position control device 104, second position control device 108, and head 114, according to the stored ejection data. Ejection data is data employed to apply the liquid material 111 onto the substrate in a prescribed pattern. In this embodiment, ejection data has the form of bitmap data.

The liquid droplet ejection device 100 configured as described above moves the nozzles 118 (see FIGS. 2A and 2B) of the head 114 relative to the substrate according to ejection data, and ejects liquid material 111 from the nozzles 118 toward the ejection-receiving portion. Relative motion of the head 114 and ejection of liquid material 111 from the head 114, caused by the liquid droplet ejection device 100, may together be called "coating scanning" or "ejection scanning".

The light irradiation device 140 irradiates the liquid material 111 which has been applied to the substrate with ultraviolet light. The control portion 112 controls the turning on and off of irradiation with ultraviolet light by the light irradiation device 140.

As shown in FIGS. 2A and 2B, the head 114 in the liquid droplet ejection device 100 is an inkjet head having a plurality of nozzles 118. Specifically, the head 114 is provided with a vibrating plate 126; a plurality of nozzles 118; a nozzle plate 128 which determines the apertures of each of the plurality of nozzles 118; a liquid reservoir 129; a plurality of partition walls 122; a plurality of cavities 120; and a plurality of vibrators 124.

The liquid reservoir 129 is positioned between the vibrating plate 126 and the nozzle plate 128. The liquid reservoir 129 is always charged with liquid material 111, supplied via the hole 131 from an external tank, not shown. The plurality of partition walls 122 are positioned between the vibrating plate 126 and the nozzle plate 128.

The cavities 120 are portions surrounded by the vibrating plate 126, nozzle plate 128, and a pair of partition walls 122. Because the cavities 120 are provided corresponding to nozzles 118, the number of cavities 120 and the number of nozzles 118 are the same. Liquid material 111 from the liquid reservoir 129 is supplied to the cavities 120 via a supply opening 130, positioned between the pair of partition walls 122. In this embodiment, the diameter of the nozzles 118 is substantially 27 µm.

Each of the plurality of vibrators 124 is positioned on the vibrating plate 126 so as to correspond to the respective cavities 120. Each of the plurality of vibrators 124 is provided with a piezoelectric element 124C, and a pair of electrodes 124A, 124B which enclose on two sides the piezoelectric element 124C. By applying a driving voltage across the pair of electrodes 124A and 124B, the control portion 112 causes liquid droplets D of the liquid material 111 to be ejected from the corresponding nozzle 118. The volume of the material ejected from the nozzle 118 is variable between 0 pl (picoliters) or more and 42 pl or less. The shape of the nozzle 118 is adjusted such that liquid droplets of the liquid material 111 are ejected from the nozzles 118 in the Z-axis direction.

The ejection portion 127 may have thermoelectric conversion elements in place of piezoelectric elements. That is, the ejection portion 12 may have a configuration in which the thermal expansion of the material due to the thermoelectric conversion elements is utilized to ejection material.

Electronic Substrate Manufacturing Method

Next, a procedure in which the above liquid droplet ejection device 100 is used to manufacture an electronic substrate is explained.

FIGS. 3A to 3E are process diagrams showing a method of manufacture of an electronic substrate. In FIGS. 3A to 3E, the reference symbols 41 and 42 indicate chip components (electronic components).

As the resin substrate 5, a polyimide or epoxy resin in a semi-cured state is used. In this invention, a semi-cured state is a state prior to providing energy to a resin which cures upon the provision of energy, by heating, or by irradiation with UV or other light.

As the chip components 41 and 42, a chip inductor, chip resistor, chip thermistor, diode, varistor, LSI bare chip, LSI package, or similar can be used. Each of the chip components 41 and 42 has electrodes 41a and 42a, which are external connection electrodes.

Similarly, the semiconductor element 40 has electrodes 40a which are external connection electrodes. The electrodes 40a are provided as metal bumps formed by electroless plating of Ni/Au or similar on the Al electrode portions 40b.

Figure 3A:
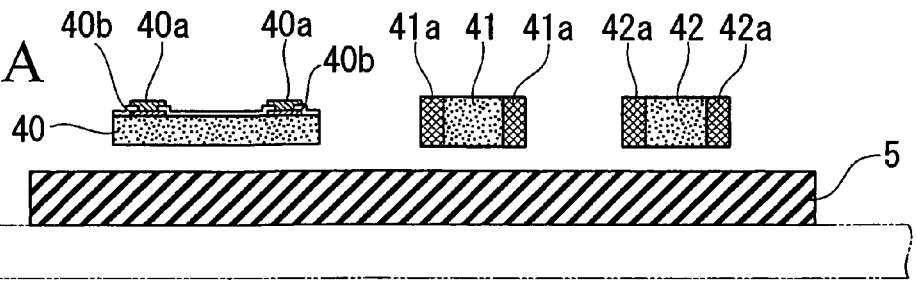
FIG. 3A, FIG. 3B, FIG. 3C, FIG. 3D, and FIG. 3E are process diagrams showing a method of manufacture of an electronic substrate of this invention.

When mounting the semiconductor element 40 and chip components 41 and 42 on the resin substrate 5, first a mounter or similar is used to position the semiconductor element 40 and chip components 41 and 42 at prescribed positions above the resin substrate 5, as shown in FIG. 3A. At this time, the semiconductor element 40 and chip components 41 and 42 are positioned such that the electrodes 40a to 42a are facing upward. The resin substrate 5 is set in a semi-cured state. The semiconductor element 40 and chip components 41 and 42 are heated in advance to a temperature equal to or below the curing temperature of the resin substrate 5. In this embodiment, for a resin substrate 5 which begins to cure at approximately 160° C., the semiconductor element 40 and chip components 41 and 42 are heated to approximately 100° C.

Figure 3B:
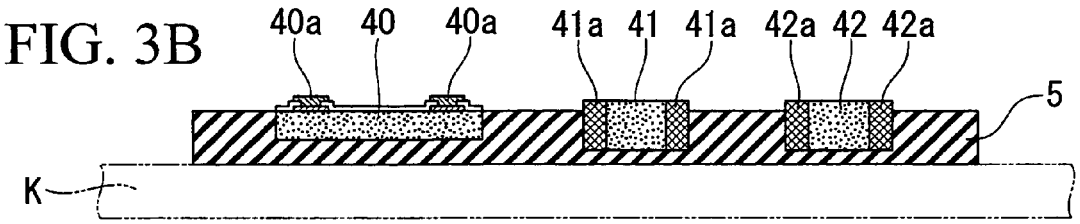

Next, the heated semiconductor element 40 and chip components 41 and 42 are brought into contact with the upper surface of the resin substrate 5. By this means, the resin substrate 5 is softened, without the occurrence of curing. By pressing the semiconductor element 40 and chip components 41 and 42 into the substrate, they are embedded in the resin substrate 5, as shown in FIG. 3B. At this time, the semiconductor element 40 and chip components 41 and 42 are each embedded to a depth such that the electrodes 40a to 42a protrude from the upper surface of the resin substrate 5.

Figure 3C:
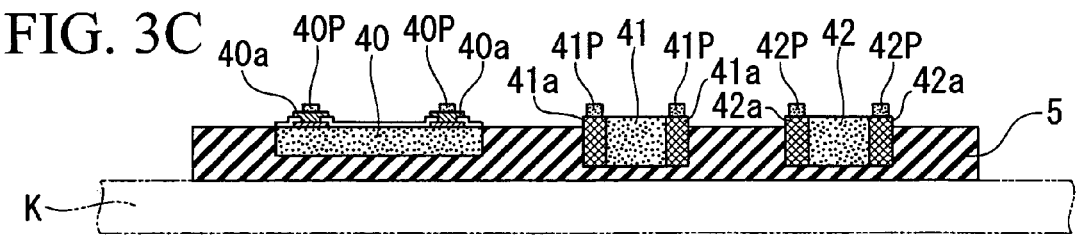

Next, the above-described liquid droplet ejection device 100 is used to eject liquid droplets containing a conductive material onto each of the electrodes 40a to 42a, as shown in FIG. 3C. By drying and baking the liquid droplets, conductive posts 40P to 42P are formed. At this time, the conductive posts 40P to 42P are formed such that the heights of the apexes are substantially the same.

As the conductive material in this embodiment, silver particles of average diameter approximately 10 nm and a dispersing medium were included. In this conductive material, the silver particles were dispersed stably in the dispersing medium. The silver particles may be covered with a coating agent. The coating agent is a compound which can be coordinated with silver particles.

Particles with average diameter ranging from approximately 1 nm to approximately 100 nm are called "nanoparticles". Hence the conductive material contains silver nanoparticles.

As the dispersing medium (or solvent), it is sufficient that the medium is able to disperse silver particles or other conductive fine particles without coagulation, and otherwise no constraints in particular are imposed. In addition to water, other examples of compounds which can be used are methanol, ethanol, propanol, butanol and other alcohols; n-heptane, n-octane, decane, dodecane, tetradecane, toluene, xylene, cymene, durene, indene, dipentene, tetrahydronaphthalene, decahydronaphthalene, cyclohexylbenzene, and other hydrocarbon-system compounds; ethylene glycol dimethylethyl, ethylene glycol diethyl ether, ethylene glycol methylethyl ether, ethylene glycol dimethyl ether, diethylene glycol diethyl ether, diethylene glycol methylethyl ether, 1,2-dimethoxyethane, bis (2-methoxyethyl) ether, p-dioxane, and other ether-system compounds; and also propylene carbonate, γ-butyrolactone, N-methyl-2-pyrolidone, dimethyl formamide, dimethyl sulfoxide, cyclohexanone, and other polar compounds. Of these, it is preferable that water, alcohols, hydrocarbon-system compounds, and ether system compounds be used, due to their dispersive properties for fine conductive particles and the stability of disperse solutions, as well as the ease of application to the liquid droplet ejection method; and it is still more preferable that water or a hydrocarbon-system compound be used as the dispersing medium.

Figure 3D:
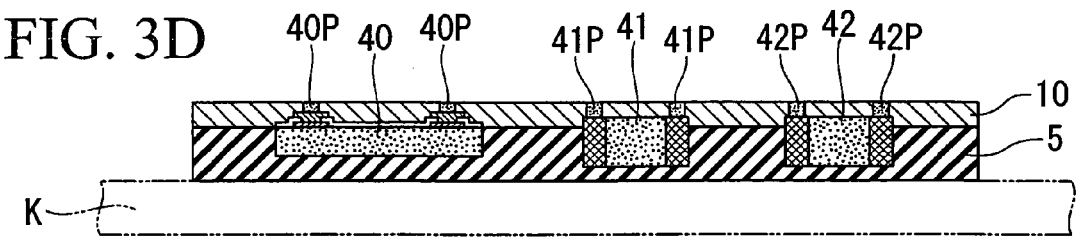

Next, the liquid droplet ejection device 100 is used to eject liquid droplets containing an insulating layer formation material onto the resin substrate 5 so as to expose the apexes of the conductive posts 40P to 42P and form an insulating layer 10, as shown in FIG. 3D.

When forming an insulating layer 10 through this insulating layer formation process, the total number of liquid droplets ejected onto the resin substrate 5, the positions of adhesion of the liquid droplets, and the intervals between positions of adhesions of liquid droplets are adjusted such that the surface of the insulating layer 10 is substantially flat, and moreover the insulating layer 10 surrounds the side faces of the electrodes 40a to 42a. Furthermore, in this embodiment the total number of liquid droplets ejected, or the intervals between positions at which the liquid droplets are made to adhere, are adjusted such that the thickness of the insulating layer 10 does not exceed the thickness of the electrodes 40a to 42a.

As insulating layer formation materials in this embodiment, for example, materials containing photosensitive resin materials may be used. Specifically, the insulating layer formation material may contain a photopolymerization initiator, and an acrylate monomer and/or oligomer.

Figure 3E:
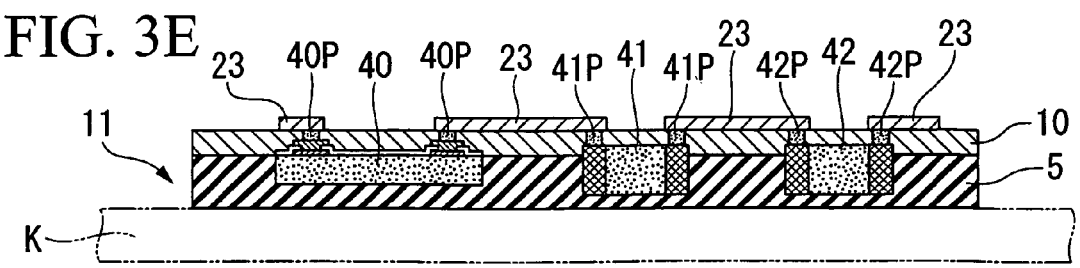

Next, the liquid droplet ejection device 100 is used to eject liquid droplets containing a conductive material in prescribed positions on the insulating layer 10, to form a wiring pattern 23 connected to the conducting posts 40P to 42P, as shown in FIG. 3E. As the conductive material used to form the wiring pattern 23, the same materials as those used for the conductive posts 40P to 42P can be employed.

A process may be provided in which, prior to ejecting liquid droplets containing the conductive material to form the wiring pattern 23, the surface of the insulating layer 10 is endowed with liquid repellent properties.

Specifically, a solution of a raw material compound (for example FAS) and the resin substrate 5 having an insulating layer 10 are placed in the same sealed container, and left for substantially two to three days at room temperature. As a result, a self-organizing film (that is, a FAS film) consisting of an organic molecule film is formed on the surface. In this way, by imparting liquid repelling properties to the insulating layer 10, the extent of wetting broadening of liquid droplets ejected onto the insulating film 10 is reduced, so that a wiring pattern 23 with narrow line widths can be formed.

Thereafter, the resin substrate 5 in a semi-cured state, together with the insulating layer 10 and wiring pattern 23, is heated to a temperature equal to or above the curing temperature, so that an electronic substrate 11 in which a semiconductor element 40 and chip components 41 and 42 are mounted on a resin substrate 5 can be manufactured.

As explained above, in this embodiment a semiconductor element 40 and chip components 41 and 42 are embedded in a resin substrate 5, so that compared with a case in which the semiconductor element 40 and chip components 41 and 42 are placed on a resin substrate 5, an electronic substrate 11 can be obtained which is thinner and has a higher mounting density. Furthermore, in this embodiment the wiring pattern 23 and the conductive posts 40P to 42P are formed using a liquid droplet ejection method, so that there is little waste in material consumption. Also, an arbitrary pattern can be drawn easily and precisely without using photolithography or other means, contributing to lower costs and increased productivity.

In this embodiment, by heating the semiconductor element 40 and chip components 41 and 42 to a temperature lower than the curing temperature of the resin substrate 5, the resin substrate 5 is softened, so that the task of embedding the semiconductor element 40 and chip components 41 and 42 is made easier, contributing to improved productivity. In this embodiment the resin substrate 5, insulating layer 10 and wiring pattern 23 are simultaneously heated and cured, so that there is high adhesion between the resin substrate 5 and insulating layer 10, and high adhesion between the insulating layer 10 and the wiring pattern 23, and an electronic substrate 11 of excellent quality can be obtained.

In the above embodiment, in order to facilitate embedding, a process is provided in which the semiconductor element 40 and chip components 41 and 42 are heated; however, this invention is not limited thereto, and a procedure may be employed in which embedding is performed by pressing in an unheated state.

Furthermore, in the above embodiment a procedure was employed in which the insulating layer 10 was formed after forming the conductive posts 40P to 42P; but the opposite procedure may be employed, forming the conductive posts 40P to 42P after forming the insulating layer 10.

Multilayer Structure Substrate

Next, a multilayer structure substrate having the above electronic substrate 11 is described.

Figure 4:
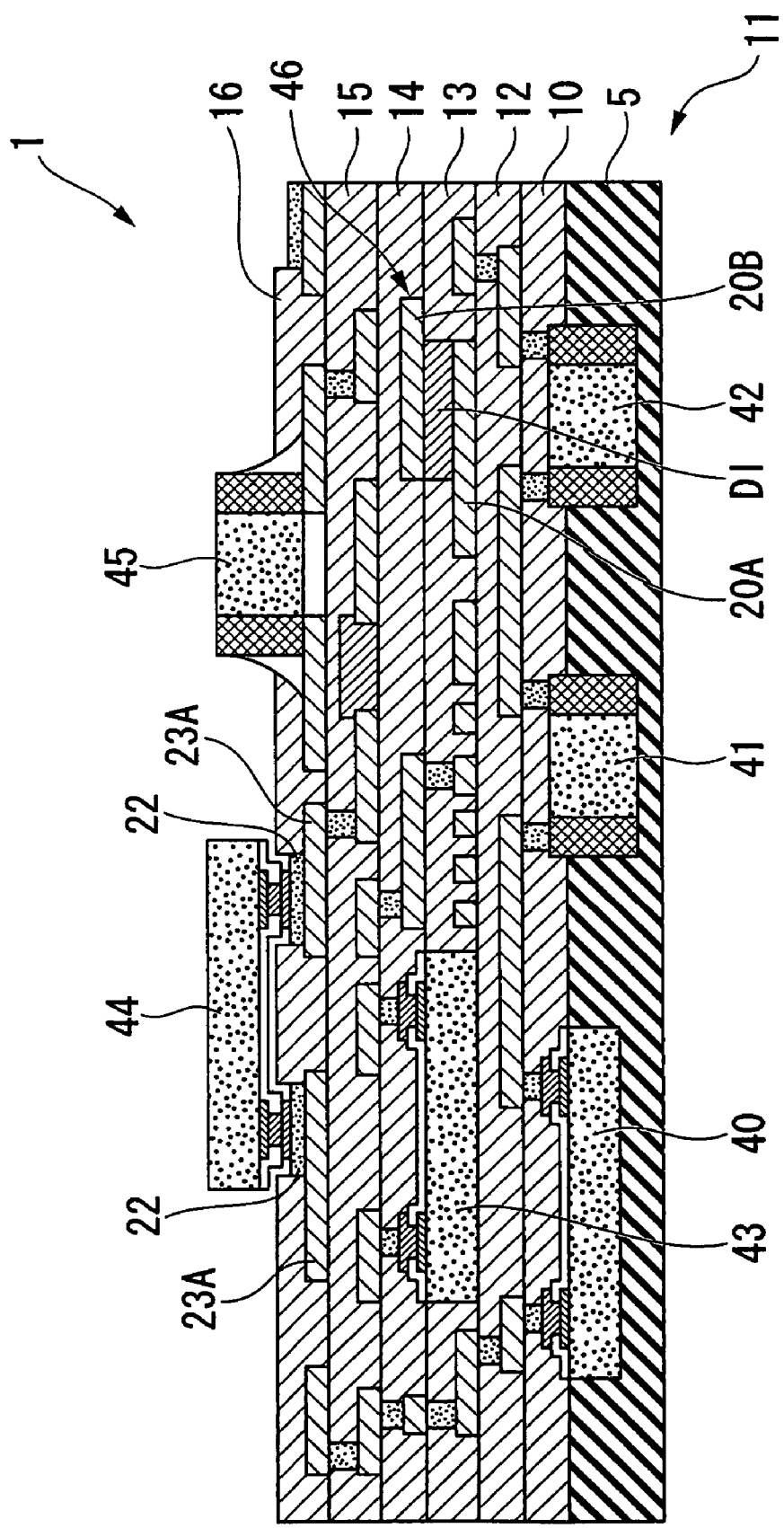
FIG. 4 is a cross-sectional view of a multilayer-structure substrate.

The multilayer structure substrate of this embodiment is a multilayer structure substrate (semiconductor device) 1 having the structure shown in FIG. 4, manufactured by repeating, for electronic substrates 11 manufactured by the processes shown in FIGS. 3A to 3E, the insulating layer formation, conducting post formation, wiring pattern formation and similar, in processes similar to those in the above embodiment.

Specifically, in the multilayer structure substrate of FIG. 4, insulating layers 12 to 16 are layered, in this order, on the insulating layer 10. The semiconductor element 43 is embedded in the multilayer structure substrate 1 by means of the insulating layers 13, 14, and in addition the semiconductor element 44 and chip component 45 are positioned and mounted in the uppermost portion. In each of the insulating layers 12 to 16, similarly to the above-described first embodiment, wiring patterns are formed, and conductive posts are formed at prescribed positions so as to penetrate the insulating layers.

In such a multilayer structure substrate 1, liquid droplets (resistive ink) containing a resistor forming material, liquid droplets (high-inductance ink) containing a high-inductance forming material, and similar can be used, to form resistors, capacitors, inductances, and other electronic elements.

For example, an inductance layer DI is formed by the liquid droplet ejection method on electrodes 20A which are a wiring pattern formed on an insulating layer 12, shown in FIG. 4. After forming the insulating layer 13, the liquid droplet ejection method is used to form the electrodes 20B as the wiring pattern on the inductance layer DI. The inductance layer DI and electrodes 20A and 20B form a capacitor 42, which is an electronic element. The liquid material which is ejected in order to form the inductance layer DI in the liquid droplet ejection process is basically the same as the insulating layer forming material.

In the multilayer structure substrate 1, when using solder to connect the semiconductor element 44 and similar, it is preferable that a solderable metal film 22 be formed on the wiring pattern 23A formed using the liquid droplet ejection method. As the metal film 22 used in this case, electroless plated Ni/Au, and a film formed by a method of using the liquid droplet ejection method to apply a liquid containing fine metal particles, can be used.

In this embodiment, the above-described electronic substrate manufacturing method is employed, so that a multilayer structure substrate 1 which is thin and has high density can be obtained.

Semiconductor Device

Figure 5:
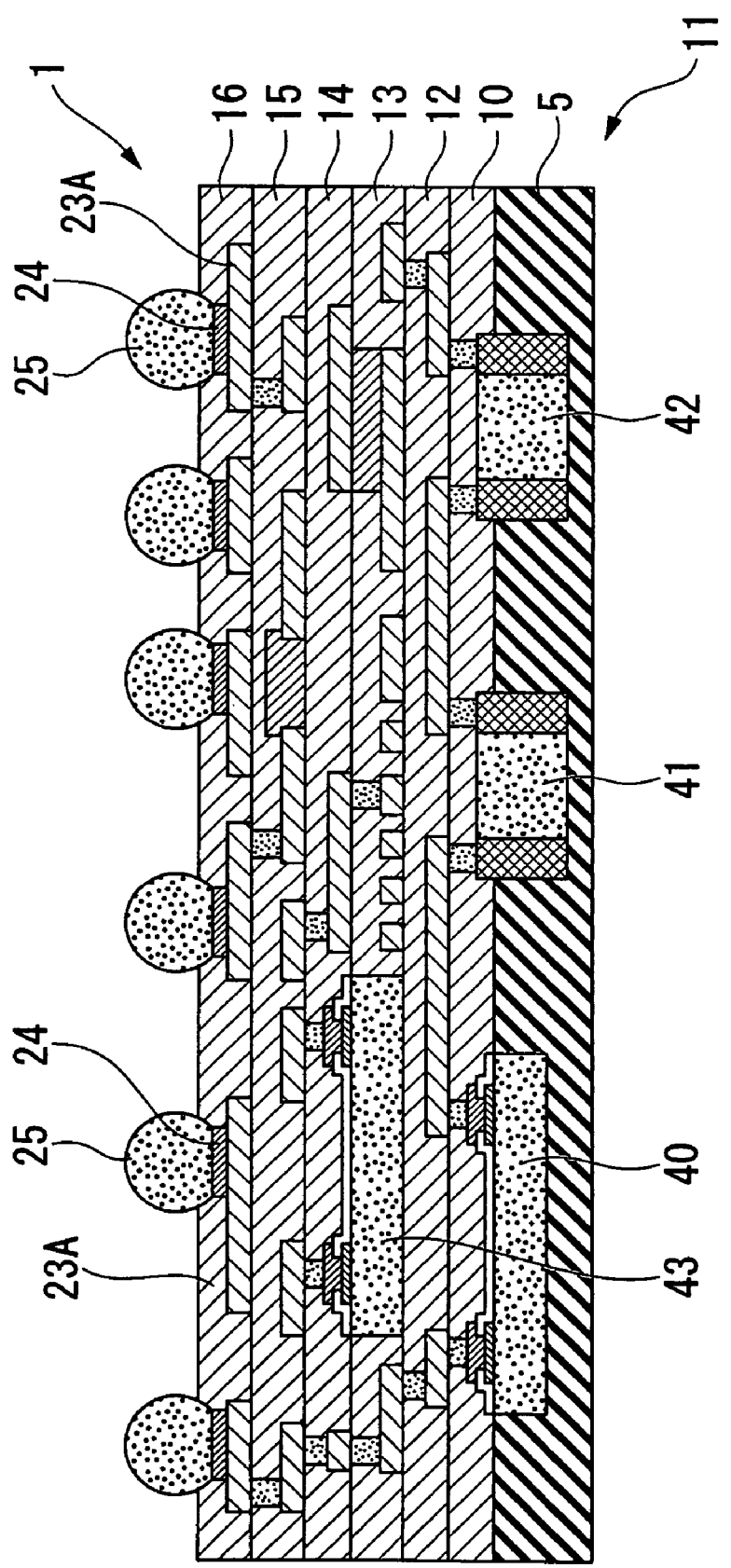
FIG. 5 is a cross-sectional view of a multilayer-structure substrate in which are provided external connection terminals.

Next, a method of manufacture of a semiconductor device is explained. In the semiconductor device of this embodiment, electrodes 24 are provided on the wiring pattern 23A formed on the insulating layer 15 as shown in FIG. 5 in the multilayer structure substrate 1 having the electronic substrate 11 shown in FIG. 4, and external connection terminals 25 are provided on each of the electrodes 24.

As a method of manufacture of this semiconductor device, the above-described liquid droplet ejection method is used to eject liquid droplets containing a conductive material onto the insulating layer 15 to form the wiring pattern 23A, and in addition electroless Ni/Au plating and a method of applying a liquid containing fine metal particles using a liquid droplet ejection method are employed to form electrodes 24 on the wiring pattern 23A.

Next, liquid droplets containing an insulating layer formation material are ejected to form the insulating layer 16, omitting the connection regions in which electrodes 24 and external connection terminals 25 are formed; after this, liquid droplets containing fine metal particles are ejected onto the connection regions to form the external connection terminals 25.

In this manner, by using a multilayer structure substrate 1 having an electronic substrate 11, a semiconductor device which is thin and dense can be obtained.

In the above semiconductor device, a procedure was used in which the electrodes 24, insulating layer 16, and external connection terminals 25 are formed in order; however, other procedures are possible, and for example a procedure in which the electrodes 24 and external connection terminals 25 are formed after forming the insulating layer 16, and a procedure in which the insulating layer 16 is formed after forming the electrodes 24 and external connection terminals 25, may be employed. In these procedures, when the insulating layer 16 is formed last, it is preferable that the wiring pattern 23A be rendered lyophilic, such that liquid droplets containing insulating material wet the surface and spread in the lower portion of the external connection terminals 25 also.

Figure 6:
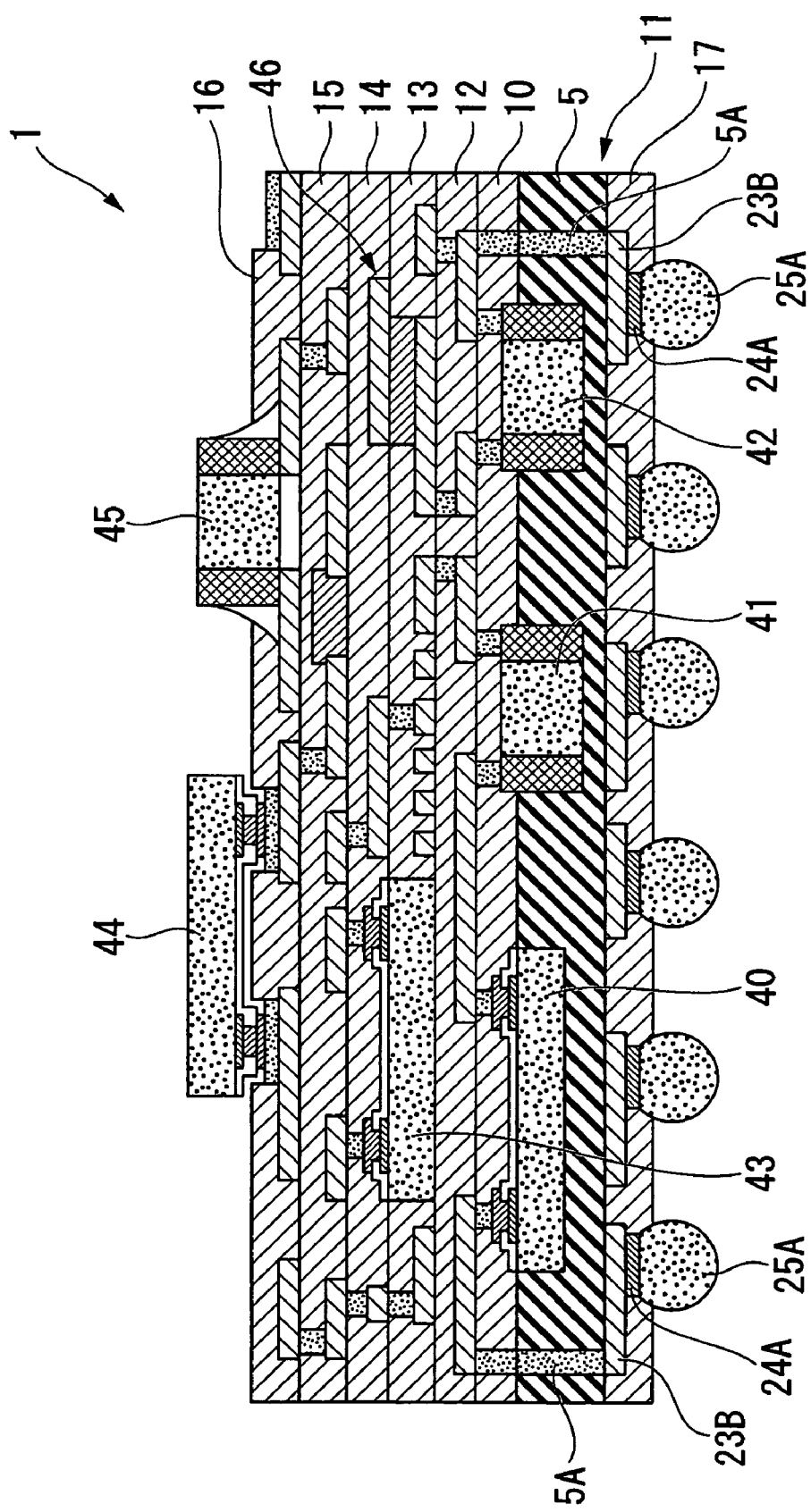
FIG. 6 is a cross-sectional view of a multilayer-structure substrate of another type, in which are provided external connection terminals.

In addition to the configuration shown in FIG. 5, a semiconductor device can be manufactured in which penetrating electrodes 5A which penetrate the resin substrate 5 are provided, as shown in FIG. 6, and a wiring pattern connected to the penetrating electrodes on the surface on the side opposite the insulating layer 10 (the rear surface) of the resin substrate 5 is formed (in FIG. 6, only the wiring pattern 23B on both ends is connected to the penetrating electrodes 5A), and on this wiring pattern 23B are provided electrodes 24A and external connection terminals 25A, similarly to the above-described electrodes 24 and external connection terminals 25A.

As a method of manufacture of this semiconductor device, after using the above-described liquid droplet ejection method to eject liquid droplets containing conductive material into penetrating holes formed in the resin substrate 5 to form the penetrating electrodes 5A, liquid droplets containing a conductive material are ejected onto the rear surface of the resin substrate 5 to form the wiring layer 23B so as to be connected to the penetrating electrodes 5A, and a method similar to that for the electrodes 24 is used to form the electrodes 24A.

Next, after ejecting liquid droplets containing an insulating layer formation material to form an insulating layer 17, omitting the connection regions in which electrodes 24A and external connection terminals 25A are formed, liquid droplets containing fine metal particles are ejected in the connection regions to form the external connection terminals 25A.

In this way, a semiconductor device can be obtained which is thin and of high density, and which has external connection terminals 25A formed on the rear side of the multilayer structure substrate 1.

Electronic Equipment

Figure 7:
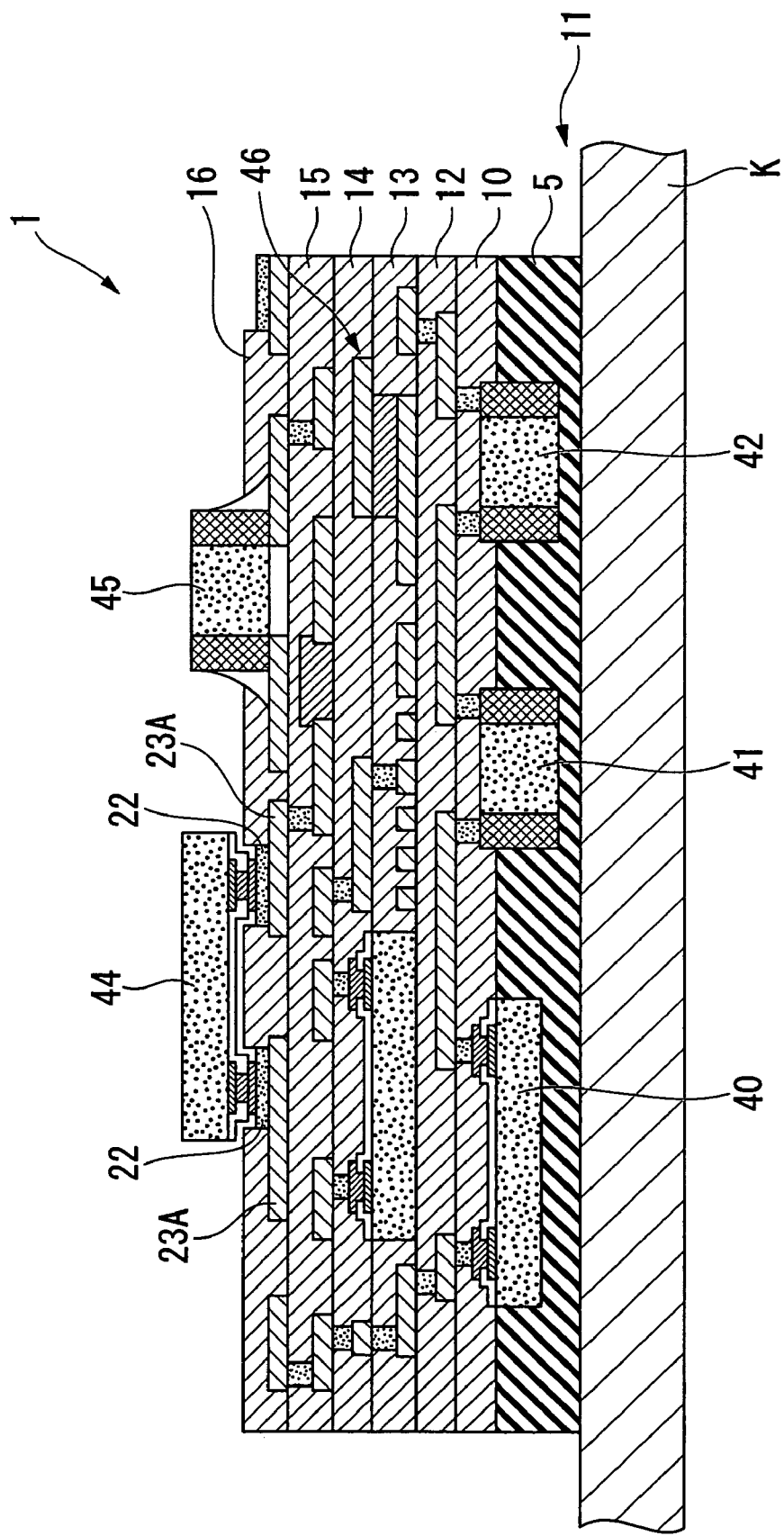
FIG. 7 is a cross-sectional view showing the housing of electronic equipment in which is fixed by bonding a multilayer-structure substrate.

Next, a method of manufacture of electronic equipment is described. FIG. 7 is a cross-sectional view in which a multilayer structure substrate 1 having an electronic substrate 11 is bonded and fixed to an electronic equipment housing K at the resin substrate 5.

When manufacturing this electronic equipment, a process may be provided of bonding to the housing K after manufacturing the multilayer structure substrate 1 shown in FIG. 4; or, a process may be provided of embedding a semiconductor element 40 and chip components 41 and 42, forming the conductive posts, insulating layers, wiring patterns and similar, as shown in FIGS. 3B to 3E, after bonding the resin substrate 5 to the housing K, as indicated by the double-dot-dash line in FIG. 3A.

Figure 8:
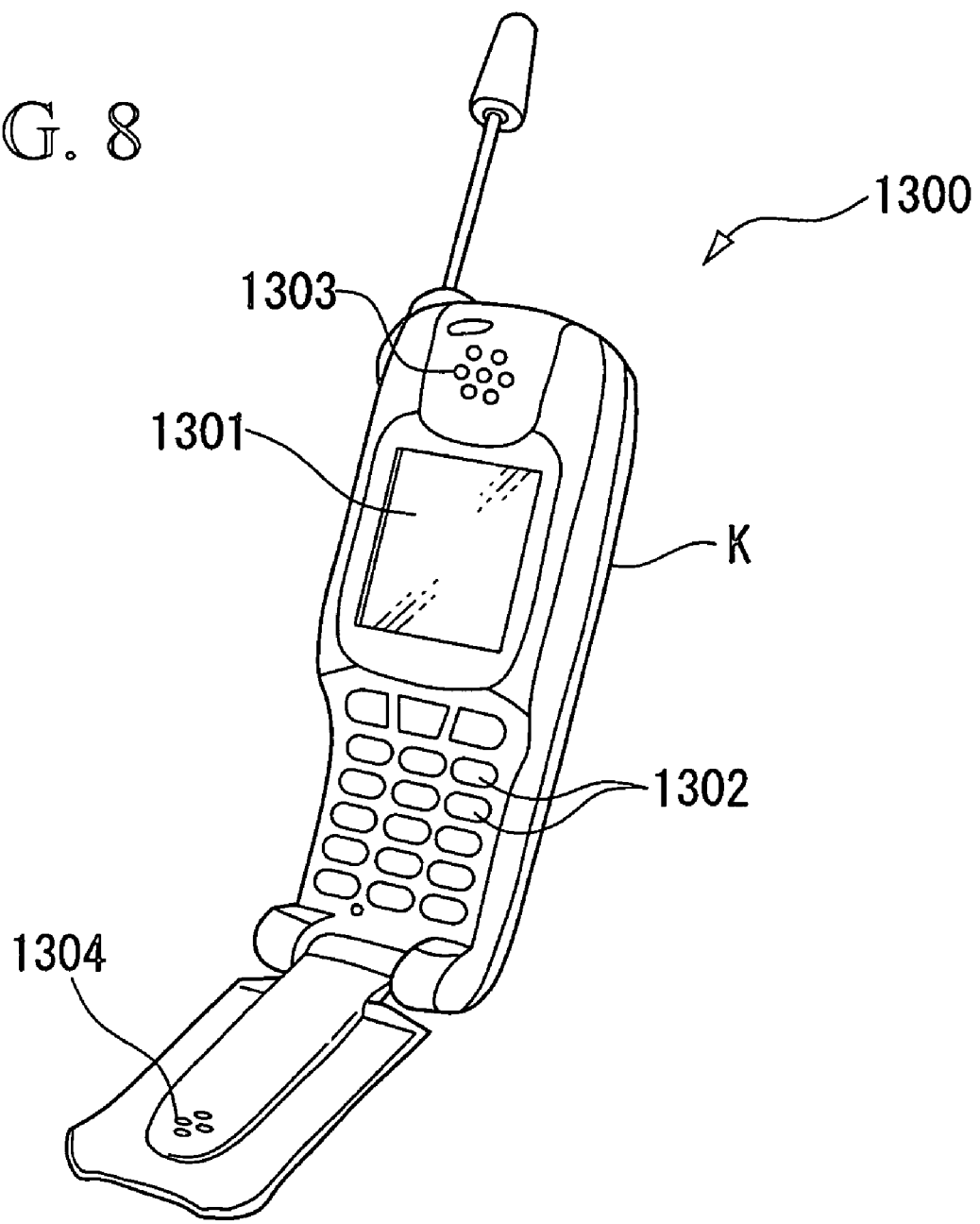
FIG. 8 is a perspective view showing one example of electronic equipment.

FIG. 8 is a perspective view showing an example of electronic equipment of this invention, having the above-described multilayer structure substrate 1. The portable telephone (electronic equipment) 1300 shown in this figure is provided with a liquid crystal device as a small-size display portion 1301, as well as a plurality of operation buttons 1302, a receiver 1303, and a transmitter 1304; the above-described multilayer structure substrate 1 is bonded to and mounted within the housing K.

The portable telephone 1300 of this embodiment is manufactured using the above-described electronic equipment manufacturing method, so that electronic equipment which is thin, with high density and highly functional, can be obtained.

The electronic equipment of the above embodiment is not limited to the above portable telephone, and application to electronic book readers, personal computers, digital still cameras, LCD televisions, viewfinders or direct-view monitor type videotape recorders, car navigation devices, pagers, electronic organizers, calculators, word processors, workstations, phones with television functions, POS terminals, equipment provided with touchscreens, and similar, is possible; any of these electronic equipment and devices can be made thinner, with higher density, and enhanced functionality.

In addition, preferred embodiments of this invention have been described referring to the attached drawings; but of course this invention is not limited to the examples given. In the above-described examples, the shapes and combinations of various component members and similar are merely examples, and various modifications can be made without deviating from the gist of the invention, based on design requirements and similar.

For example, when forming the wiring pattern 23 shown in FIG. 3E, a procedure may be employed in which a die having protrusions and depressions according to a wiring pattern is pressed against the insulating layer 10, so that groove portions and partition wall portions (banks) surrounding the groove portions are formed in the insulating layer 10 according to the wiring pattern, and liquid droplets containing a conductive material are applied to the groove portions.

By means of this manufacturing method, a wiring pattern can be formed having a width and height corresponding to the width and depth of the groove portions, and a pattern with narrow line widths can be formed with high precision.

In the above embodiments, configurations were described in which conductive materials contained silver nanoparticles; however, in place of silver nanoparticles, nanoparticles of another metal may be used. As the other metal, for example, any one among gold, platinum, copper, palladium, rhodium, osmium, ruthenium, iridium, iron, tin, zinc, cobalt, nickel, chromium, titanium, tantalum, tungsten, or indium may be used; or, an alloy combining any two or more among these may be used. However, if silver is used reduction is possible at a comparatively low temperature, so that handling is easy; in this respect, when utilizing a liquid droplet ejection device, it is preferable that a conductive material containing nanoparticles of silver be used.

Furthermore, the form of the metal contained in the liquid-state conductive material may be a particle form, of which nanoparticles are representative, or may be a compound such as a metallorganic compound.

Moreover, in place of a metal, the conductive material may contain a polyaniline, polythiophene, polyphenylene vinylene, or other soluble polymer material.

The silver nanoparticles in the conductive material may be covered with an organic or other coating agent. As such a coating agent, amines, alcohols, thiols, and other materials are known. More specifically, coating agents include 2-methylamino ethanol, diethanolamine, diethylmethyl amine, 2-dimethylamino ethanol, methyl diethanolamine, and other amine compounds, alkyl amines, ethylenediamine, alkly alcohols, ethylene glycol, propylene glycol, alkyl thiols, ethane dithiol, and similar. Silver nanoparticles covered with a coating agent can be dispersed more stably in a dispersing medium.

Furthermore, in the above embodiments, insulating materials consisting of a photopolymerization initiator and an acrylate monomer and/or oligomer were used; but in place of an acrylate monomer and/or oligomer, the insulating material may contain a photopolymerization initiator and a monomer and/or oligomer having a vinyl group, epoxy group, or other polymerizing functional group.

Also, as the insulating material, an organic solution in which a monomer having a photo-functional group is dissolved may be used. Here, as a monomer having a photo-functional group, a photosetting imide monomer can be used.

When the monomer itself which is the resin material has fluidity appropriate for ejection from the nozzles 118, in place of using an organic solution into which the monomer has been dissolved, the monomer itself (that is, a monomer fluid) may be used as the insulating material. An insulating layer can be formed when using such an insulating material as well.

Furthermore, the insulating material may be an organic solution in which the polymer which is the resin has been dissolved. In this case, toluene can be used as the solvent in the insulating material.

What is claimed is:

1. A manufacturing method of an electronic substrate, the method comprising:
    embedding electronic components in a first surface of a resin substrate, the electronic components being discrete components, the first surface being in a semi-cured state, the semi-cured state being a state prior to providing energy to a resin which cures upon the provision of energy, by heating or by irradiation with UV or other light;
    forming an insulating layer on the first surface, in which the electronic components have been embedded, of the resin substrate, the insulating layer covering the electronic components and the first surface, at least a part of external connection electrodes of the electronic components being exposed from the insulating layer; and
    forming a wiring pattern connected to at least the external connection electrodes of the electronic components, the forming of the wiring pattern comprising disposing first liquid droplets containing conductive material on the first surface of the resin substrate on which the insulating layer has been formed,
    wherein the embedding of the electronic components comprises:
        heating the electronic components to a temperature lower than a curing temperature of the resin substrate;
        bringing the heated electronic components into contact with a plurality of places on the resin substrate and causing the places of the resin substrate to be selectively softened; and
        pressing the electronic components into the softened places on the resin substrate.

2. The manufacturing method according to claim 1, wherein the electronic components comprise at least two among a chin inductor, chip resistor, chip thermistor, diode, faristor, LSI bare chip, and LSI package.

3. The manufacturing method according to claim 1, wherein the resin substrate is formed using a polyimide or epoxy resin sheet material in a semi-cured state.

4. The manufacturing method according to claim 1, further comprising imparting a liquid repelling property to the insulating layer, the liquid repelling property being with respect to the first liquid droplets.

5. The manufacturing method according to claim 1, wherein
    the forming of the insulating layer comprising disposing second liquid droplets containing an insulating material on the first surface of the resin substrate,
    the disposing of the second liquid droplets comprising adjusting:
        a total number of the second liquid droplets being disposed on the resin substrate,
        disposing positions of the second liquid droplets on the resin substrate, and
        an interval between the disposing positions of the second liquid droplets, such that the insulating layer is substantially flat.

6. The manufacturing method according to claim 1, further comprising simultaneously curing at least two of the group consisting of:
    the resin substrate in a semi-cured state,
    the insulating layer, and
    the wiring pattern,
    wherein the resin substrate is heated to a temperature equal to or above a curing temperature of the resin substrate.

7. The manufacturing method according to claim 1, further comprising forming a conductive post by disposing the first liquid droplets containing a conductive material, the conductive post penetrating the insulating layer and connected to the external connection electrodes and to the wiring pattern.

8. The manufacturing method according to claim 1, wherein the forming of the wiring pattern and the forming of the insulating layer are repeated.

9. The manufacturing method according to claim 8, further comprising ejecting other liquid droplets containing an electronic element formation material to form an electronic element.

10. A manufacturing method of a semiconductor device, comprising,
mounting a semiconductor element on a resin substrate by the manufacturing method of an electronic substrate according to claim 1.

11. The manufacturing method according to claim 10, further comprising ejecting the first liquid droplets containing a conductive material to form a external connection terminal connected to the semiconductor element.

12. The manufacturing method according to claim 11, wherein the external connection terminal is connected to the semiconductor element via a penetrating electrode which penetrates the resin substrate.

13. A manufacturing method of electronic equipment, comprising,
mounting a semiconductor device on a substrate, the semiconductor device manufactured by the manufacturing method of a semiconductor device according to claim 10.

14. The manufacturing method according to claim 13, wherein the mounting comprises:
bonding a resin substrate formed from resin sheet material in a semi-cured state to a housing which supports the semiconductor device;
embedding a semiconductor element in the resin substrate; and
forming a wiring pattern connecting an external connection electrode of the semiconductor element embedded in the resin substrate.

15. A manufacturing method of an electronic substrate, the method comprising:
embedding electronic components in a first surface of a resin substrate in a semi-cured state, the electronic components being discrete components, the resin substrate having softening temperature lower than a curing temperature thereof, the embedding of the electronic components comprising:
heating the electronic components to a temperature lower than the curing temperature of the resin substrate,
bringing the heated electronic components into contact with the resin substrate and causing a plurality of places on the resin substrate to be selectively softened while external connection terminals of the electronic components face a direction away from the resin substrate, and
pressing the electronic components into the softened places on the resin substrate with depths such that at least a part of the external connection terminals of the electronic components protrudes from the first surface of the resin surface;
forming an insulating layer on the first surface, in which the electronic components have been embedded, of the resin substrate, the insulating layer covering the electronic components and the first surface, at least a part of external connection electrodes of the electronic components being exposed from the insulating layer;
forming a wiring pattern connected to at least the external connection electrodes of the electronic components, the forming of the wiring pattern comprising disposing first liquid droplets containing conductive material on the first surface of the resin substrate on which the insulating layer has been formed; and
simultaneously curing at least two of the group consisting of: the resin substrate in a semi-cured state; the insulating layer; and the wiring pattern at a temperature equal to or above the curing temperature.

* * * * *